United States Patent
Park et al.

(10) Patent No.: US 10,043,951 B2
(45) Date of Patent: Aug. 7, 2018

(54) LIGHT EMITTING DEVICE PACKAGE AND METHOD OF MANUFACTURING THE SAME

(71) Applicant: SAMSUNG ELECTRONICS CO., LTD., Suwon-si, Gyeonggi-do (KR)

(72) Inventors: Jung Kyu Park, Seoul (KR); Jung Sung Kim, Seoul (KR); Woo Jung Park, Hwaseong-si (KR); Chang Su Park, Yongin-si (KR); Tae Young Choi, Seoul (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 15/421,975

(22) Filed: Feb. 1, 2017

(65) Prior Publication Data

US 2017/0358716 A1   Dec. 14, 2017

(30) Foreign Application Priority Data

Jun. 14, 2016 (KR) .................. 10-2016-0073856

(51) Int. Cl.
| | |
|---|---|
| H01L 33/62 | (2010.01) |
| H01L 33/48 | (2010.01) |
| H01L 33/50 | (2010.01) |
| H01L 33/60 | (2010.01) |

(52) U.S. Cl.
CPC .......... *H01L 33/486* (2013.01); *H01L 33/507* (2013.01); *H01L 33/60* (2013.01); *H01L 33/62* (2013.01)

(58) Field of Classification Search
CPC ...................................................... H01L 33/62
See application file for complete search history.

(56) References Cited

U.S. PATENT DOCUMENTS

| | | | |
|---|---|---|---|
| 6,372,608 | B1 | 4/2002 | Shimoda et al. |
| 6,645,830 | B2 | 11/2003 | Shimoda et al. |
| RE38,466 | E | 3/2004 | Inoue et al. |
| 6,818,465 | B2 | 11/2004 | Biwa et al. |
| 6,818,530 | B2 | 11/2004 | Shimoda et al. |
| 6,858,081 | B2 | 2/2005 | Biwa et al. |

(Continued)

FOREIGN PATENT DOCUMENTS

| | | |
|---|---|---|
| JP | 2004-172160 A | 6/2004 |
| JP | 2006-093632 A | 4/2006 |

(Continued)

*Primary Examiner* — Thao P Le
(74) *Attorney, Agent, or Firm* — Lee & Morse, P.C.

(57) ABSTRACT

A light emitting device package includes a package body having a mounting region including a mounting surface for a light emitting device, a groove portion, and a bottom surface lower than the mounting surface, and a lead frame supported by the package body, a portion of the lead frame being disposed on the bottom surface and a portion of the lead frame being exposed by the groove portion. The light emitting device has a first plane on which an electrode pad is disposed, a second plane opposite the first plane, and a third plane disposed between the first plane and the second plane to connect the first plane to the second plane. The light emitting device is to be disposed in the mounting region such that the first plane is in contact with the mounting surface and the electrode pad is in the groove portion.

21 Claims, 16 Drawing Sheets

(56) References Cited

U.S. PATENT DOCUMENTS

| | | | |
|---|---|---|---|
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 * | 9/2011 | Lee | H01L 33/62 257/79 |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,319,242 B2 | 11/2012 | Shiobara et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 8,987,022 B2 | 3/2015 | Yoo et al. | |
| 9,231,178 B2 | 1/2016 | Tischler | |
| 2008/0019103 A1 * | 1/2008 | Kim | F21V 29/004 361/720 |
| 2009/0321778 A1 | 12/2009 | Chen et al. | |
| 2014/0120641 A1 | 5/2014 | Kim et al. | |
| 2015/0236230 A1 | 8/2015 | Miyata | |
| 2015/0340574 A1 | 11/2015 | Tamaki | |
| 2016/0020370 A1 | 1/2016 | Cai et al. | |
| 2016/0149086 A1 * | 5/2016 | Sim | H01L 33/46 257/98 |
| 2016/0233390 A1 * | 8/2016 | Hayashi | H01L 33/20 |

FOREIGN PATENT DOCUMENTS

| | | |
|---|---|---|
| KR | 10-2015-0030114 A | 3/2015 |
| KR | 10-2016-0007452 A | 1/2016 |

* cited by examiner

LIGHT EMITTING DEVICE PACKAGE AND METHOD OF MANUFACTURING THE SAME

CROSS-REFERENCE TO RELATED APPLICATION

Korean Patent Application No. 10-2016-0073856, filed on Jun. 14, 2016, in the Korean Intellectual Property Office, and entitled: "Light Emitting Device Package and Method of Manufacturing the Same," is incorporated by reference herein in its entirety.

BACKGROUND

1. Field

Embodiments relate to a light emitting device package and a method of manufacturing the same.

2. Description of the Related Art

Recently, in order to improve the light efficiency and the heat transfer characteristics in a high current region, the development of light emitting device packages, including light emitting diodes (LEDs) having a flip chip structure, has proceeded vigorously.

SUMMARY

Embodiments are directed to providing a light emitting device package that may include a package body having a mounting region including a mounting surface for a light emitting device, a groove portion, and a bottom surface lower than the mounting surface, and a lead frame supported by the package body, a portion of the lead frame being disposed on the bottom surface and a portion of the lead frame being exposed by the groove portion. The light emitting device has a first plane on which an electrode pad is disposed, a second plane opposite the first plane, and a third plane disposed between the first plane and the second plane to connect the first plane to the second plane. The light emitting device is to be disposed in the mounting region such that the first plane is in contact with the mounting surface and the electrode pad is in the groove portion.

Embodiments are directed to providing a light emitting device package that may include a first lead frame and a second lead frame, and may include a package body supporting the first lead frame and the second lead frame and including a groove portion in which a region of the first lead frame and the second lead frame is exposed. In addition, the light emitting device package may include a light emitting device disposed to cover the groove portion of the package body and including a first electrode pad and a second electrode pad, disposed in the groove portion, to be connected to an exposed region of the first lead frame and the second lead frame, respectively. Furthermore, the light emitting device package may include a light transmissive encapsulation portion disposed on the package body and covering a top surface and a side surface of the light emitting device.

Embodiments are directed to providing a light emitting device package that may include a package body, including a mounting surface providing a mounting region for mounting a light emitting device on the mounting region and a groove portion disposed in the mounting region and providing a bottom surface lower than the mounting surface. A lead frame may have a portion supported by the bottom surface of the groove portion and a portion exposed by the groove portion. The groove portion may have a thickness, along a first direction, orthogonal to the lead frame, of a conductive bump to connect the light emitting device and the lead frame, and a width, along a second direction orthogonal to the first direction, less than that of the light emitting device.

Embodiments are directed to providing a method of manufacturing a light emitting device package, which may include forming a package body supporting a first lead frame and a second lead frame, the package body including a groove portion in which a portion of the first lead frame and the second lead frame is exposed, and mounting a light emitting device on the package body such that a first electrode pad and a second electrode pad are disposed in the groove portion and correspond to the first and second lead frames, respectively. A bottom surface of the light emitting device may be in contact with a surface of the package body, while a top surface and a side surface of the light emitting device may be separated from the package body.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
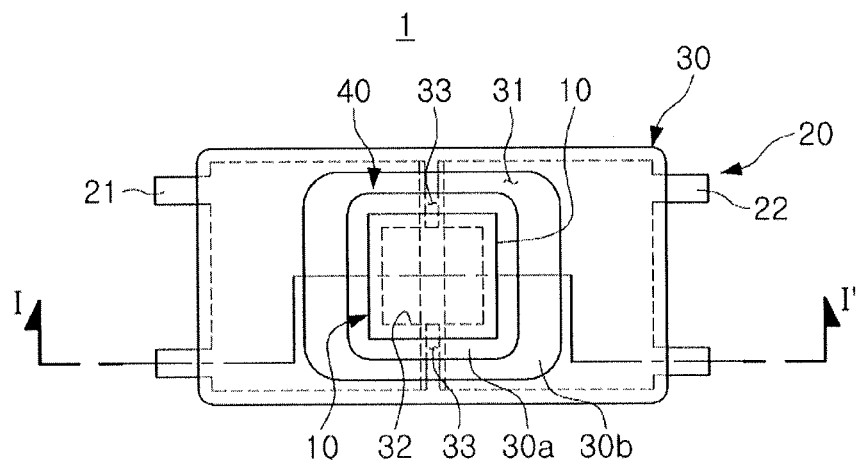
FIG. 1 illustrates a schematic plan view of a light emitting device package according to an example embodiment.
Figure 2:
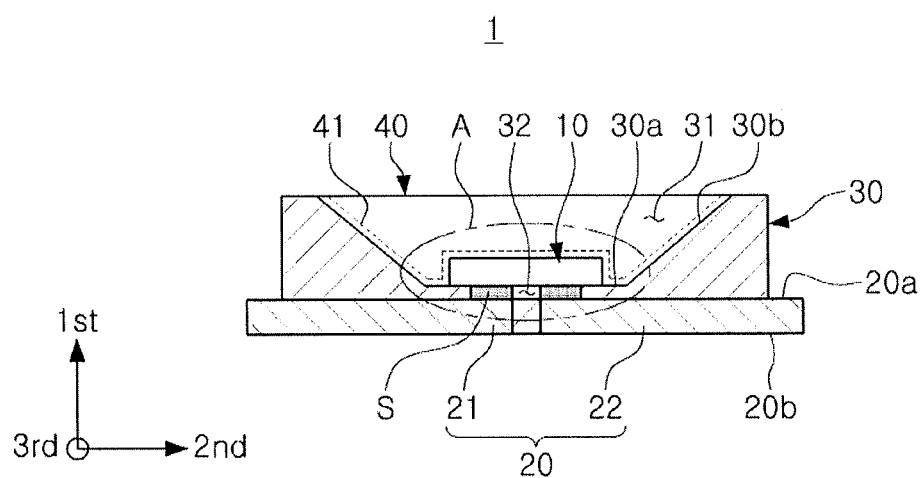
FIG. 2 illustrates a cross-sectional view taken along line I-I' of a light emitting device package illustrated in FIG. 1.
Figure 3:
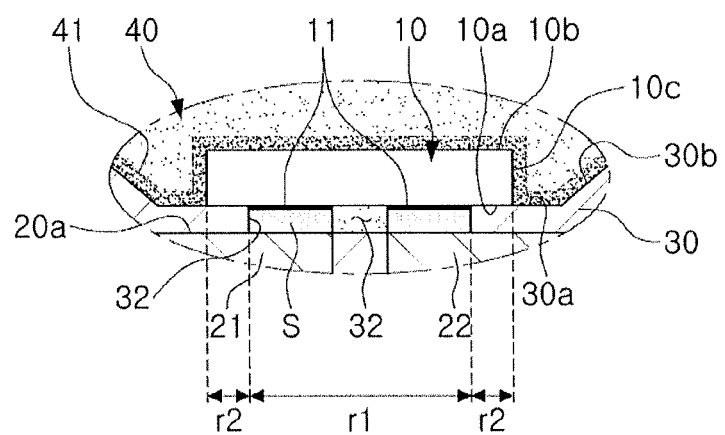
FIG. 3 illustrates an enlarged cross-sectional view of portion 'A' in FIG. 2.

With reference to FIGS. 1 to 3, a light emitting device package according to an example embodiment will be described. FIG. 1 is a schematic plan view of a light emitting device package according to an example embodiment, FIG. 2 is a cross-sectional view taken along line I-I' of a light emitting device package illustrated in FIG. 1, and FIG. 3 is an enlarged cross-sectional view of portion 'A' in FIG. 2.

With reference to FIGS. 1 to 3, a light emitting device package 1, according to an example embodiment, may include a light emitting device 10, a lead frame 20, and a package body 30. In addition, the light emitting device package 1 may further include an encapsulation portion 40 covering the light emitting device 10.

The light emitting device 10 may be provided as an optoelectronic device generating light having a predetermined wavelength by driving power applied from an external source. For example, the light emitting device 10 may include a semiconductor light emitting diode (LED) having an n-type semiconductor layer, a p-type semiconductor layer, and an active layer between the n-type semiconductor layer and the p-type semiconductor layer.

The light emitting device 10 may emit blue, green, or red light, and may also emit ultraviolet light, or the like. According to need, the light emitting device 10 may emit white light through a combination thereof with a wavelength conversion material, e.g., a phosphor. The light emitting device 10 may include an LED chip having various structures. In addition, the light emitting device 10 may include a laser diode (LD) chip having various structures.

As illustrated in FIG. 3, the light emitting device 10 may include a first plane 10a, a second plane 10b disposed opposite the first plane 10a, and a third plane 10c disposed between the first plane 10a and the second plane 10b to connect the first plane 10a to the second plane 10b. The first plane 10a, the second plane 10b, and the third plane 10c may correspond to a bottom surface, a top surface, and side surfaces of the light emitting device 10, respectively. The light emitting device 10 may include electrode pads 11 to receive driving power on the first plane 10a.

The light emitting device 10 may be bonded to the lead frame 20 by flip-chip bonding, using a conductive bump S. For example, the conductive bump S may include Sn—Ag—Cu (SAC)-based solder. The lead frame 20 may be formed of a material having high electrical conductivity, e.g., a metal, such as aluminum (Al), copper (Cu), or the like.

The lead frame 20 may have a structure in which at least one pair of lead frames is separated from and faces each other, in order to be electrically isolated. For example, the lead frame 20 may include a first lead frame 21 having a first polarity, and a second lead frame 22 having a second polarity different from the first polarity. In this case, the first polarity and the second polarity may be positive and negative, respectively (or vice versa). As shown herein, the first and second lead frames may be spaced from one another by the material used for the package body. Of course, any suitable insulating material may be employed.

The package body 30 may include the light emitting device 10 disposed thereon. In the example embodiment, a single light emitting device 10 is illustrated as being disposed on the package body 30, but the embodiments are not limited thereto.

The package body 30 may support the lead frame 20. For example, the package body 30 may cover an upper surface 20a of the lead frame 20 at a predetermined thickness. The lead frame 20 may be supported when the lead frame 20 is embedded in the package body 30. A lower surface 20b of the lead frame 20 may be exposed to a lower portion of the package body 30.

The package body 30 may include a reflective cup 31 having the light emitting device 10 disposed therein. The package body 30 may also include a mounting surface 30a, providing a mounting region to include the light emitting device 10 mounted thereon, and may include an internal side wall 30b, inclined from the mounting surface 30a toward an upper portion of the package body 30 to surround the mounting region, in the reflective cup 31.

The package body 30 may include a groove portion 32 in the mounting surface 30a. The groove portion 32 may be disposed around a central region of the mounting surface 30a.

Figure 4A:
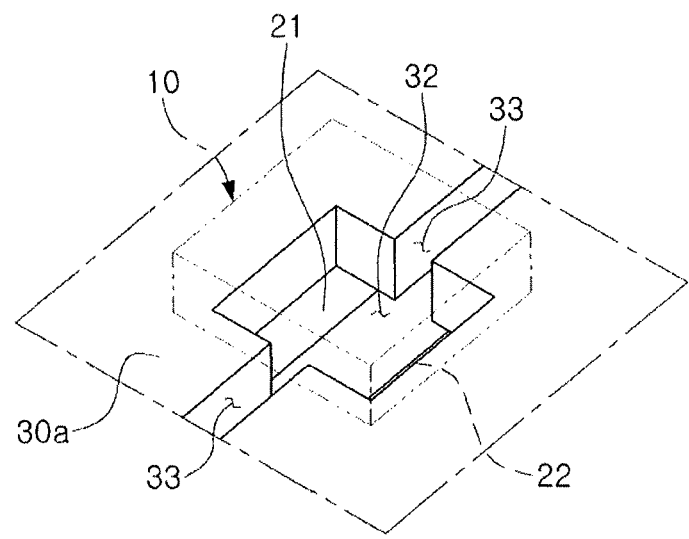
FIG. 4A illustrates a schematic perspective view of a groove portion and a connection groove.
Figure 4B:
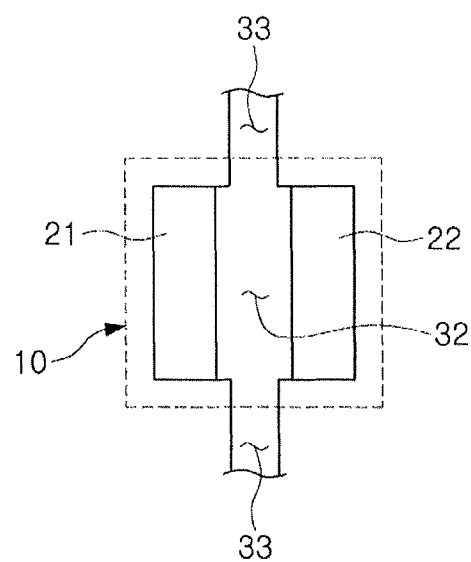
FIG. 4B illustrates a schematic plan view of FIG. 4A.

FIG. 4A is a schematic perspective view of a groove portion and a connection groove, while FIG. 4B is a plan view of FIG. 4A. With reference to FIGS. 4A and 4B, along with FIGS. 2 and 3, the groove portion 32 may provide a bottom surface lower than the mounting surface 30a.

The groove portion 32 may be recessed from the mounting surface 30a to the upper surface 20a of the lead frame 20, so that a portion of the lead frame 20 may not be covered, due to the groove portion 32. In other words, when viewed from above, the package body 30 may cover the lead frame 20, except the groove portion 32.

Taken from above, the groove portion 32 may have a cross-sectional shape (for example, a quadrangular shape) corresponding to the first plane 10a of the light emitting device 10, with an area, i.e., a surface area, thereof less than that of the first plane 10a. Further, the groove portion 32 may have a different cross-sectional shape than the first plane 10a of the light emitting device 10.

A portion of the lead frame 20 may be disposed on a bottom surface of the groove portion 32. In other words, the groove portion 32 may include a portion not covered by the package body 30, disposed below the groove portion 32 among the upper surfaces 20a of the lead frame 20, as a portion of the bottom surface of the groove portion 32.

The package body 30 may include a connection groove 33, connected to the groove portion 32 in the mounting surface 30a. The connection groove 33 may have a trench structure recessed at a predetermined depth in the mounting surface 30a, and may be extended from the groove portion 32 to the internal side wall 30b.

The connection groove 33 may act as a passage through which a resin included in the encapsulation portion 40, described below, is introduced into the groove portion 32. As shown herein, the groove portion including the encapsulation portion may overlap, e.g., completely overlap, the separation region between the first and second lead frames 21, 22.

The package body 30 may include a white molding compound having a high degree of light reflectivity. The package body 30 may also include a white composite epoxy material, e.g., FR-4, CEM-3, a white epoxy material, a white ceramic material, or the like. Therefore, light emitted by the light emitting device 10 is reflected, thus increasing light intensity outwardly emitted. The package body 30 may also include FR-4, CEM-3, an epoxy material, a ceramic material, or the like.

The white molding compound may include a highly thermally resistant thermoset resin, e.g., an epoxy molding compound (EMC) and silicone, or a thermoplastic resin, e.g. polyphthalamide (PPA) and poly cyclohexane dimethylene terephthalate (PCT) and a white pigment therein. Titanium dioxide (TiO2), zinc oxide (ZnO), or the like may be used as the white pigment. In addition, the white molding compound may further include a filler therein, such as silicon dioxide (SiO2) or the like. In addition, a curing agent, a mold release agent, an antioxidant, an adhesion promoter, and the like may be added.

As such, the groove portion 32, in a case in which the package body 30 does not cover the portion of the lead frame 20, may be disposed on the mounting surface 30a. Therefore, the light emitting device 10 may be disposed in the mounting region to cover the groove portion 32, and may be connected to the lead frame 20 that is not covered, due to the groove portion 32, by using the conductive bump S. In addition, the groove portion 32 may accommodate the conductive bump S interposed between the electrode pad 11 and the lead frame 20.

When the light emitting device 10 covers the groove portion 32, an edge of the groove portion 32 may be disposed between the electrode pad 11 and a perimeter of the light emitting device 10. In addition, the package body 30 may be disposed between the light emitting device 10 and the lead frame 20 along a region between a margin portion of the light emitting device 10 and the electrode pad 11.

Therefore, when the light emitting device 10 is mounted on the mounting surface 30a to cover the groove portion 32, the first plane 10a may be in contact with the mounting surface 30a. In detail, the first plane 10a may include a first region r1 including the electrode pad 11 disposed therein, and a second region r2 surrounding the first region r1 (see FIGS. 3 and 12). The second region r2 may be in contact with the mounting surface 30a around the groove portion 32.

The second plane 10b and the third plane 10c of the light emitting device 10 may protrude upwardly from the mounting surface 30a to be provided as a light emitting surface, and may be disposed to have a structure in which the second plane 10b and the third plane 10c are separated, e.g., spaced, from the internal side wall 30b.

The connection groove 33 may not be covered by the light emitting device 10. The connection groove 33 may be exposed to the mounting surface 30a when the light emitting device 10 is mounted on the mounting surface 30a to cover the groove portion 32.

The encapsulation portion 40 may encapsulate the light emitting device 10. The encapsulation portion 40 may be formed in such a manner that a resin, including a wavelength conversion material, is hardened. For example, an injected resin to fill the reflective cup 31 may be hardened to form the encapsulation portion 40. In addition, the injected resin may be introduced into the groove portion 32 along the connection groove 33 to fill space between the electrode pads 11 in the groove portion 32.

The encapsulation portion 40 may include a light transmissive material to allow light generated by the light emitting device 10 to be outwardly emitted, and, e.g., may include a resin, such as silicone, epoxy, or the like.

In the example embodiment, an entirety of a surface of the encapsulation portion 40 is illustrated as flat, but embodiments are not limited thereto. For example, the encapsulation portion 40 may have a dome-shaped lens structure in which a surface is convex. Additionally or alternatively, a separate lens may be attached onto the encapsulation portion 40.

The encapsulation portion 40 may include a wavelength conversion material. The wavelength conversion material may include at least one or more types of phosphor. A relatively large amount of phosphor may be disposed in a region adjacent to surfaces of the light emitting device 10 and the package body 30. For example, as illustrated in an example embodiment, the phosphor may form a phosphor layer 41 covering the light emitting device 10, the mounting surface 30a, and the internal side wall 30b of the reflective cup 31.

The phosphor layer 41 may correspond to a multilayer structure formed in such a manner that a relatively large amount of phosphor included in the encapsulation portion 40 is distributed in a lower portion of the reflective cup 31 by sedimentation and the like. The phosphor layer 41 may cover the second plane 10b and the third plane 10c of the light emitting device 10. According to an example embodiment, the phosphor layer 41 may be manufactured to have a thin-film shape, and may be attached to a surface of the light emitting device 10.

According to the example embodiment, the light emitting device package may have a structure in which the upper surface 20a of the lead frame 20 is covered with the package body 30, except a portion in which the upper surface 20a of the lead frame 20 is connected to the conductive bump S due to the groove portion 32. The light emitting device 10 may be mounted on the package body 30 in a structure in which a bottom surface of the light emitting device 10 is in contact with the mounting surface of the package body 30. In addition, the electrode pad 11 and the conductive bump S, disposed in the groove portion 32, may not be exposed in such a manner that the light emitting device 10 may cover the groove portion 32. In particular, the groove portion 32 may extend in a first direction, orthogonal to an upper surface of the lead frame 20, to a height of the conductive bump S used to attach the light emitting device 10 to the lead frame 20, and may extend in a second direction, orthogonal to the first direction, a distance less than a width of the light emitting device 10 in the first direction.

Further, as may be seen in FIG. 4A, the groove portion 32 may have a width in a third direction, orthogonal to the first and second direction, less than that of the light emitting device 10. Further, the connection groove 33 may extend along the second direction from the groove portion 32 and may have a width along the third direction less than that of the groove portion.

In a comparative configuration, a gap between the light emitting device 10 and the lead frame 20 may be present due to a thickness of the conductive bump S being interposed between the light emitting device 10 and the lead frame 20. Due to this gap, light generated by LEDs may be scattered by phosphors included in an encapsulation portion, and a portion of light entering below the LEDs is absorbed by the solder, resulting in optical loss.

In contrast, in the example embodiment, since the bottom surface of the light emitting device 10 is in contact with the surface of the package body 30, such a gap is avoided. Therefore, optical loss may be reduced or prevented.

In addition, in the example embodiment, the light emitting device package may have a structure in which only the bottom surface of the light emitting device 10 is in contact, e.g., direct contact, with the surface of the package body 30, while the side surface and the top surface of the light emitting device 10 may be separated from the package body 30, i.e., may not be in contact therewith. Therefore, a degradation problem, such as yellowing of the package body 30 by light or heat generated by the light emitting device 10, may be alleviated. In other words, when the remainder of a region not including the bottom surface of the light emitting device 10 is separated from the package body 30 by a predetermined interval, the phosphor may be intensively concentrated around the light emitting device 10, thus converting a wavelength of light reaching the package body 30 into as a long wavelength of light as possible. Therefore, a problem of discoloration of the package body 30 and degradation of luminous flux, caused by light having a short wavelength, may be prevented.

In addition, in the example embodiment, the package may have a structure in which a groove portion surrounds a margin portion of an electrode pad to allow a position of the light emitting device to be defined by the groove portion. In other words, when the bottom surface of the light emitting device is in contact with a surface of a package body, the electrode pad and a conductive bump are disposed in the groove portion. Therefore, when the conductive bump S is bonded by flip-chip bonding, the conductive bump S melts, and the melted portion may spread. The area to which the melted conductive bump S may spread may be limited to an interior of the groove portion. Therefore, a problem in the prior art, where conductive bump S spreads along a surface of a lead frame, allowing the light emitting device 10 to rotate or move, so that a mounting position was pushed out of place and reliability deteriorated, may be prevented. In contrast, in a comparative configuration without the groove portion, a light emitting device may not be flatly joined to the package when using solder and/or may deviate from the intended position, e.g., due to rotation thereof, or the like.

Figure 5:
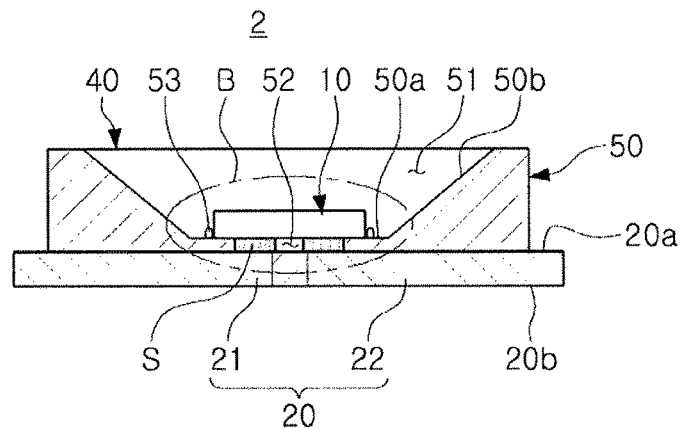
FIG. 5 illustrates a schematic cross-sectional view of a light emitting device package according to an example embodiment.
Figure 6:
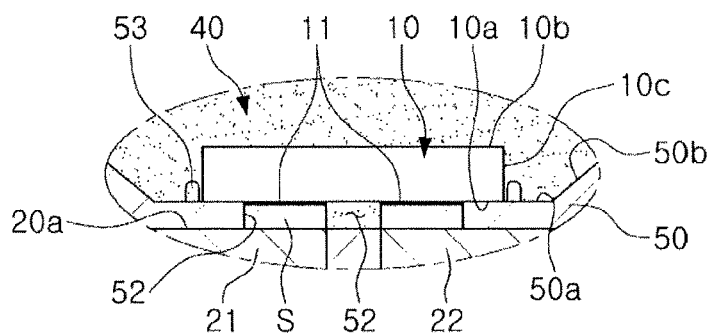
FIG. 6 illustrates an enlarged cross-sectional view of portion 'B' in FIG. 5.
Figure 7:
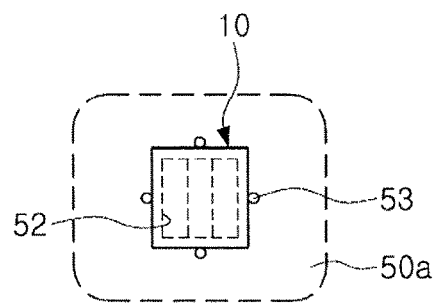
FIG. 7 illustrates a schematic plan view of FIG. 6.

With reference to FIGS. 5 to 7, a light emitting device package according to an example embodiment will be described. FIG. 5 is a schematic cross-sectional view of the light emitting device package according to an example embodiment, FIG. 6 is an enlarged cross-sectional view of portion 'B' in FIG. 5, and FIG. 7 is a plan view of FIG. 6.

With reference to FIGS. 5 to 7, a light emitting device package 2, according to an example embodiment, may include the light emitting device 10, the lead frame 20, a package body 50, and an encapsulation portion 40.

A basic composition of the light emitting device package 2, according to an example embodiment illustrated in FIGS. 5 to 7, may be substantially the same as that of a light emitting device package 1 according to an example embodiment illustrated in FIGS. 1 to 4. However, the package body 50 may be different from a package body 30 in an example embodiment illustrated in FIGS. 1 to 4 in that the package body 50 may further include a protrusion 53.

The package body 50 may include a reflective cup 51 with the light emitting device 10 therein. The package body 50 may include a mounting surface 50a providing a mounting region on which the light emitting device 10 is to be mounted, and may include an internal side wall 50b, inclined from the mounting surface 50a toward an upper portion of the package body 50, in the reflective cup 51.

The package body 50 may include a groove portion 52 in the mounting surface 50a. The groove portion 52 may be disposed around a central region of the mounting surface 50a. The groove portion 52 may provide a bottom surface lower than the mounting surface 50a. The groove portion 52 may be recessed from the mounting surface 50a to the lead frame 20, so that a portion of the lead frame 20 may not be covered due to the groove portion 52. In other words, taken from above, the package body 50 may cover the lead frame 20, except for the groove portion 52.

Taken from above, the groove portion 52 may have a cross-sectional shape (e.g., a quadrangular shape), corresponding to a first plane 10a of the light emitting device 10. However, an area thereof may be smaller than that of the first plane 10a. In addition, the groove portion 52 may include a portion not covered by the package body 50, disposed below the groove portion 52 among the lead frames 20, as a portion of the bottom surface of the groove portion 52. A portion of the lead frame 20 may be disposed on the bottom surface of the groove portion 52.

The package body 50 may include the protrusion 53, to define a mounting position of the light emitting device 10 on the mounting surface 50a. The protrusion 53 may include a plurality of protrusions 53 disposed on the mounting surface 50a around the groove portion 52. The protrusion 53 may have a height less than a thickness of the light emitting device 10, in order to significantly reduce interference with light emitted from a side surface of the light emitting device 10.

A distance between a pair of protrusions 53 opposing each other across the groove portion 52 may be greater than a length of the light emitting device 10. Therefore, the light emitting device 10 mounted on the package body 50 may be disposed between the protrusions 53.

The protrusion 53 may act as a fiducial mark to guide the mounting position of the light emitting device 10. In addition, the protrusion 53 may fix the light emitting device 10 not to allow the light emitting device 10 to rotate or move in the mounting position by the melted conductive bump S when being bonded by flip-chip bonding. Therefore, a problem in which the light emitting device 10 is not in the mounting position, or the like, may be reliably prevented from occurring.

Figure 8:
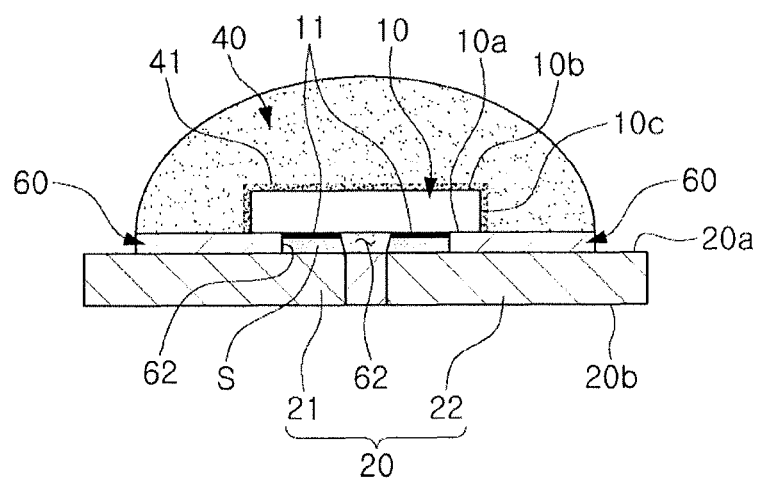
FIG. 8 illustrates a schematic cross-sectional view of a light emitting device package according to an example embodiment.

With reference to FIG. 8, a light emitting device package according to an example embodiment will be described. FIG. 8 is a schematic cross-sectional view of a light emitting device package according to an example embodiment.

With reference to FIG. 8, a light emitting device package 3, according to an example embodiment, may include the light emitting device 10, the lead frame 20, a package body 60, and an encapsulation portion 40.

A basic composition of the light emitting device package 3 according to an example embodiment illustrated in FIG. 8 may be substantially the same as that of the light emitting device package 1 according to an example embodiment illustrated in FIGS. 1 to 4. However, the package body 60 of FIG. 8 may be different from a package body 30 in an example embodiment illustrated in FIGS. 1 to 4 in that the package body 60 may not include a reflective cup.

With reference to FIG. 8, the package body 60 may cover an upper surface 20a of the lead frame 20 at a predetermined thickness. An entirety of a surface of the package body 60 may have a flat structure. A central region of the package body 60 may be provided as a mounting region on which the light emitting device 10 is mounted, and a groove portion 62 may be formed therein. The groove portion 62 may be recessed from a surface of the package body 60 to the lead frame 20, so that a portion of the lead frame 20 may not be covered due to the groove portion 62.

The light emitting device 10 may be disposed on the surface of the package body 60 to cover the groove portion 62. In addition, the light emitting device 10 may be connected to the lead frame 20 not covered by the package body 60 in the groove portion 62, by using the conductive bump S. The groove portion 62 may include the conductive bump S interposed between an electrode pad 11 and the lead frame 20.

When the light emitting device 10 is disposed on the groove portion 62, an edge of the groove portion 62 may be disposed between the electrode pad 11 and a perimeter of the light emitting device 10 (e.g., the third plane (10c)). In other words, the groove portion 62 may have a structure in which the groove portion 62 surrounds a perimeter of the electrode pad 11 disposed adjacently to an edge of the light emitting device 10.

Therefore, when the light emitting device 10 is mounted on the surface of the package body 60 to cover the groove portion 62, the light emitting device 10 may be disposed to have a structure in which only the first plane 10a is in contact with the surface of the package body 60, and the second plane 10b and the third plane 10c protrude upwardly from the surface. In other words, the second plane 10b, a top surface of the light emitting device 10, and the third plane 10c, a side surface thereof, may be disposed at a position higher than the surface of the package body 60. In addition, light emitted by the second plane 10b and the third plane 10c of the light emitting device 10 may be outwardly irradiated at a relatively wide beam angle.

The encapsulation portion 40 may encapsulate the light emitting device 10 on the package body 60. The encapsulation portion 40 may cover an entirety of the surface of the package body 60, or a portion of the surface thereof. The encapsulation portion 40 may include a phosphor layer 41, covering a surface of the light emitting device 10. In addition, the encapsulation portion 40 may have a dome-shaped structure, but is not limited thereto.

Figure 9:
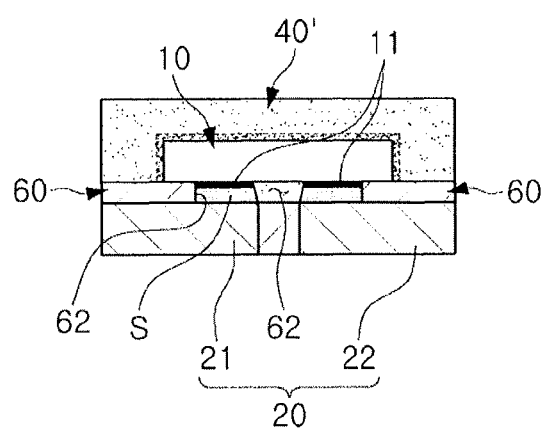
FIG. 9 illustrates a schematic cross-sectional view of a light emitting device package according to an example embodiment.

A light emitting device package 3' in FIG. 9 illustrates an encapsulation portion 40' having a quadrangular shape. Herein, side surfaces of the package body 60 and the lead frame 20 may be coplanar, and the encapsulation portion 40' may have side surfaces that are coplanar with side surfaces of the package body 60 and the lead frame 20.

Figure 10:
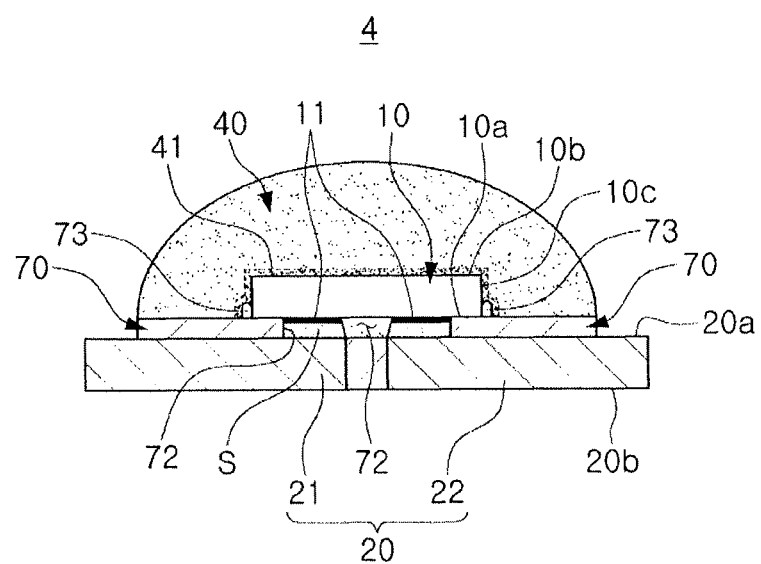
FIG. 10 illustrates a schematic cross-sectional view of a light emitting device package according to an example embodiment.

With reference to FIG. 10, a light emitting device package according to an example embodiment will be described. FIG. 10 is a schematic cross-sectional view of a light emitting device package according to an example embodiment.

With reference to FIG. 10, a light emitting device package 4, according to an example embodiment, may include the light emitting device 10, the lead frame 20, a package body 70, and the encapsulation portion 40.

A basic composition of the light emitting device package 4, according to an example embodiment illustrated in FIG. 10 may be substantially the same as that of a light emitting device package 3, according to an example embodiment illustrated in FIG. 8. However, the package body 70 may be different from the package body 60 in an example embodiment illustrated in FIG. 8 in that the package body 70 may further include a protrusion 73.

The package body 70 may cover an upper surface of the lead frame 20 at a predetermined thickness. At the same time, an entirety of a surface of the package body 70 may have a flat structure.

A central region of the package body 70 may be provided as a mounting region on which the light emitting device 10 is mounted, and a groove portion 72 may be formed therein. The groove portion 72 may be recessed from a surface of the package body 70 to the lead frame 20, so that a portion of the lead frame 20 may not be covered due to the groove portion 72.

The groove portion 72 may provide a bottom surface lower than a surface of the package body 70, while a region of the lead frame 20 may be disposed on the bottom surface of the groove portion 72.

The light emitting device 10 may be disposed on the groove portion 72, in order to be connected to the lead frame 20, disposed on the bottom surface of the groove portion 72, by using the conductive bump S. The groove portion 72 may accommodate the conductive bump S, interposed between the electrode pad 11 and the lead frame 20.

The package body 70 may include a plurality of protrusions 73 disposed around the groove portion 72. The plurality of protrusions 73 may be disposed around the grove portion 72 to have a structure in which the plurality of protrusions 73 may surround the groove portion 72. The protrusion 73 may have a height less than a thickness of the light emitting device 10, in order to significantly reduce interference with light emitted from a side surface of the light emitting device 10.

A distance between a pair of protrusions 73 opposing each other across the groove portion 72 may be greater than a length of the light emitting device 10. Therefore, the light emitting device 10 mounted on the package body 70 may be disposed between the protrusions 73.

The protrusion 73 may have substantially the same structure and function as that of a protrusion 53, according to an example embodiment illustrated in FIG. 5. Therefore, a detailed description of the function of the protrusion 73 will be understood with reference to an example embodiment described above (e.g., see FIG. 5).

Light emitting device packages according to example embodiments may emit light having a variety of colors. To this end, a wavelength conversion material, e.g., at least one type of a phosphor, excited by light generated by the light emitting device 10 to emit light having a different wavelength may be included in the encapsulation portion 40, 40'.

For example, when the light emitting device 10 emits blue light, yellow, green, red and/or orange phosphors may be combined to emit white light. In addition, the light emitting device 10 may include at least one of the light emitting devices 10 emitting violet, blue, green, red, or infrared light. In this case, a color rendering index (CRI) of a light emitting device 10 may be controlled to be within a range of about 40 to about 100. Furthermore, the light emitting device 10 may generate various types of white light having color temperatures in a range of around 2,000 K to around 20,000 K. Also, if necessary, the light emitting device 10 may generate visible violet, blue, green, red, orange or infrared light to adjust the color of light in consideration of a surrounding atmosphere and a desired user mood. In addition, the light emitting device 10 may also generate light having a specific wavelength for promoting plant growth.

White light formed through a combination of yellow, green and red phosphors, and a blue light emitting device, and/or through a combination of the blue light emitting device and green and red light emitting devices, may have two or more peak wavelengths. Additionally, coordinates (x, y) thereof in a CIE 1931 color space chromaticity diagram illustrated in FIG. 11 may be positioned on a line segment connecting coordinates (0.4476, 0.4074), (0.3484, 0.3516), (0.3101, 0.3162), (0.3128, 0.3292), and (0.3333, 0.3333). Alternatively, the coordinates (x, y) thereof in the CIE 1931 color space chromaticity diagram may be positioned in a region surrounded by the line segment and a blackbody radiation spectrum. A color temperature of the white light may range from about 2,000 K to about 20,000 K.

Figure 11:
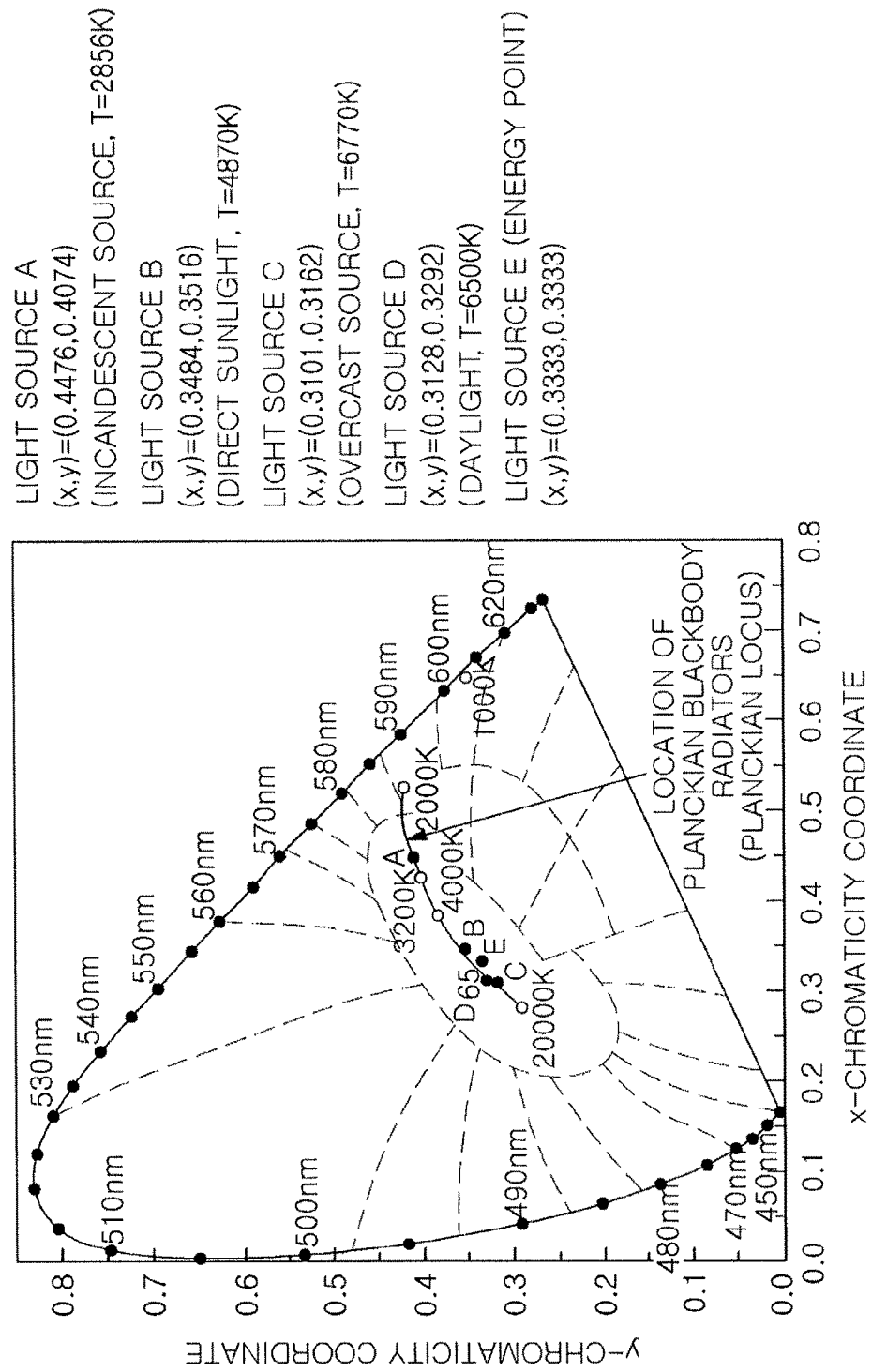
FIG. 11 illustrates a CIE 1931 color space chromaticity diagram illustrating a phosphor employable herein.

In FIG. 11, white light in the vicinity of point E (0.3333, 0.3333,) disposed below the blackbody radiation spectrum, may be in a state in which a level of yellow light is relatively low, and may be used as a lighting light source in a region exhibiting brighter or fresher feeling to a naked eye. Therefore, lighting products using white light in the vicinity of point E (0.3333, 0.3333) disposed below the blackbody radiation spectrum, may be highly effective as a lighting device for retail spaces in which consumer goods are offered for sale.

The phosphors may have the following empirical formulas and colors.

Oxides: yellow and green $Y_3Al_5O_{12}$:Ce, $Tb_3Al_5O_{12}$:Ce, $Lu_3Al_5O_{12}$:Ce Silicates: yellow and green $(Ba,Sr)_2SiO_4$:Eu, yellow and orange $(Ba,Sr)_3SiO_5$:Ce Nitrides: green $\beta$-SiAlON:Eu, yellow $La_3Si_6N_{11}$:Ce, orange $\alpha$-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ (0.5≤x≤3, 0<z<0.3, 0<y≤4) (where Ln is at least one element selected from group Ma elements and rare-earth elements, and M is at least one element selected from Ca, Ba, Sr, and Mg)

Fluorides: KSF-based red $K_2SiF_6$:$Mn^{4+}$, $K_2TiF_6$:$Mn^{4+}$, $NaYF_4$:$Mn^{4+}$, $NaGdF_4$:$Mn^{4+}$ and $K_3SiF_7$:$Mn^{4+}$ Phosphor compositions should basically conform to stoichiometry, and respective elements may be substituted with other elements of respective groups of the periodic table. For example, strontium (Sr) may be substituted with barium (Ba), calcium (Ca), magnesium (Mg), and the like within the alkaline earth group (II), and yttrium (Y) may be substituted with lanthanum (La)-based elements such as terbium (Tb), lutetium (Lu), scandium (Sc), gadolinium (Gd), and the like. Also, europium (Eu), an activator, may be substituted with cerium (Ce), terbium (Tb), praseodymium (Pr), erbium (Er), ytterbium (Yb), and the like, according to a desired energy level, and an activator may be applied alone or with a co-activator for modifying characteristics of phosphors.

In detail, in order to enhance reliability at high temperatures and high humidity, a fluoride-based red phosphor may be coated with a fluoride not containing manganese (Mn) or may further include organic materials coated on surfaces of a phosphor or fluoride coating not containing Mn. In a manner different from other phosphors, the fluoride-based red phosphor may implement a narrow full width at half maximum equal to or less than 40 nm, and thus being used in a high resolution TV, such as a UHD TV.

Furthermore, in the case of the wavelength conversion material, as a phosphor substitute, a quantum dot (QD) or the like may be used, and the QD may be used alone or in combination with the phosphor.

The QD may have a core-shell structure using group III-VI or group II-V compound semiconductors. For example, the QD may have a core, such as cadmium selenide (CdSe) or indium phosphide (InP), or a shell, such as zinc sulfide (ZnS) or zinc selenide (ZnSe). In addition, the QD may include a ligand to stabilize the core and shell. For example, the core may have a diameter in a range of about 1 nm to about 30 nm, and, in detail, of about 3 nm to about 10 nm. The shell may have a thickness in a range of about 0.1 nm to about 20 nm, and, in detail, of about 0.5 nm to about 2 nm.

The QD may implement various colors of light depending on a size thereof, and, for example, in a case in which the QD is used as the phosphor substitute, it may be substituted for a red or a green phosphor. In a case in which the QD is used, a narrow full width at half maximum (e.g., about 35 nm) may be implemented.

Hereinafter, a description of a light emitting device employable in a light emitting device package according to an example embodiment will be provided.

Figure 12:
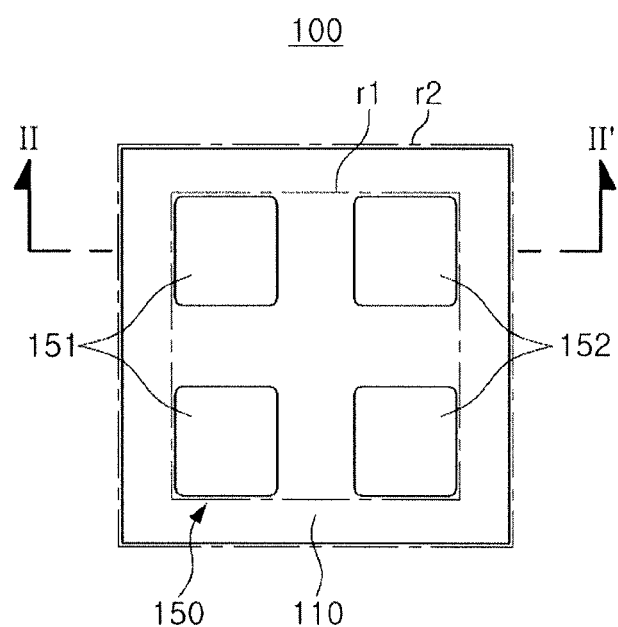
FIG. 12 illustrates a schematic bottom view of a light emitting device according to an example embodiment.
Figure 13:
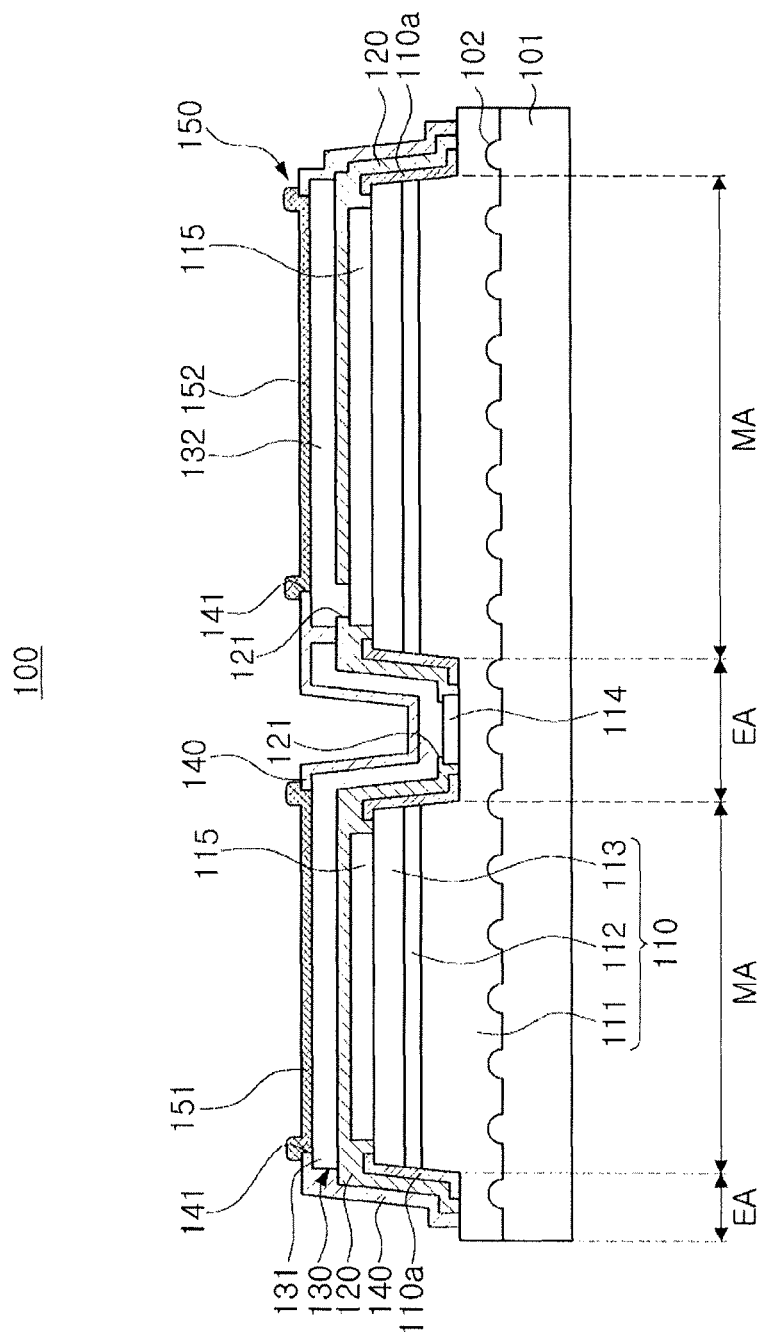
FIG. 13 illustrates a cross-sectional view taken along line II-II' of a light emitting device illustrated in FIG. 12.

FIGS. 12 and 13 are schematic views of a light emitting device according to an example embodiment. FIG. 12 is a schematic bottom view of a light emitting device according to an example embodiment, and FIG. 13 is a cross-sectional view taken along line II-II' of a light emitting device illustrated in FIG. 12.

As illustrated in FIG. 12, an entirety of the light emitting device 100 may have a quadrangular shape taken from a lower portion in a vertical direction. In addition, the light emitting device 100 may have a structure in which a plurality of electrode pads 150 is exposed to a lower portion thereof.

As illustrated in FIG. 3, the light emitting device 100 may include a first region r1, including the plurality of electrode pads 150 disposed therein, and a second region r2 surrounding the first region r1. A shape of the light emitting device 100 is not limited thereto, but may have a shape, such as a triangle, a hexagon, or other polygons.

With reference to FIG. 13, the light emitting device 100 may include a light emitting structure 110, a first insulating layer 120, an electrode layer 130, a second insulating layer 140, and an electrode pad 150.

The light emitting structure 110 may have a structure in which a plurality of semiconductor layers are stacked, and may include a first conductivity-type semiconductor layer 111, an active layer 112, and a second conductivity-type semiconductor layer 113, stacked on a growth substrate 101 in sequence.

The growth substrate 101 may be provided as a semiconductor growth substrate, and may include an insulating material, a conductive material, or a semiconductor material, such as sapphire, silicon (Si), silicon carbide (SiC), magnesium aluminate spinel ($MgAl_2O_4$), magnesium oxide (MgO), lithium aluminum oxide ($LiAlO_2$), lithium gallate ($LiGaO_2$), gallium nitride (GaN), or the like.

On a top surface of the growth substrate 101, that is, on a surface on which semiconductor layers are grown, a plurality of concave-convex structures 102 may be formed. Due to the concave-convex structure 102, crystalline properties and light emission efficiency of the semiconductor layers may be improved. The example embodiment illustrates the concave-convex structure 102 having a convex dome shape, but embodiments are not limited thereto. The concave-convex structure 102 may be formed to have various shapes, such as a quadrangle, a triangle, or the like. In addition, the concave-convex structure 102 may be selectively formed and provided. Therefore, the concave-convex structure 102 may be omitted.

The growth substrate 101 may be removed later, according to an example embodiment. In more detail, the growth substrate 101 may be provided as a growth substrate to allow the first conductivity-type semiconductor layer 111, the active layer 112, and the second conductivity-type semiconductor layer 113 to be grown, and may be removed through a separation process. The growth substrate 101 may be separated from a semiconductor layer through the use of one or more methods, such as a laser lift off (LLO) method, a chemical lift off (CLO) method, or the like.

The first conductivity-type semiconductor layer 111 stacked on the growth substrate 101 may include a semiconductor doped with an n-type impurity, and may be provided as an n-type nitride semiconductor layer. In addition, the second conductivity-type semiconductor layer 113 may include a semiconductor doped with a p-type impurity, and may be provided as a p-type nitride semiconductor layer. However, a stacking order of the first conductivity-type semiconductor layer 111 and the second conductivity-type semiconductor layer 113 may be changed. The first conductivity-type semiconductor layer 111 and the second conductivity-type semiconductor layer 113 may be formed of a material having a composition of $Al_xIn_yGa_{(1-x-y)}N$ ($0 \leq x<1$, $0 \leq y<1$, $0 \leq x+y<1$), such as GaN, AlGaN, InGaN, AlInGaN, or the like.

The active layer 112 disposed between the first conductivity-type semiconductor layer 111 and the second conductivity-type semiconductor layer 113 may emit light having a predetermined level of energy through a recombination of an electron and a hole. The active layer 112 may include a material having a lower level of energy band gap than that of the first conductivity-type semiconductor layer 111 and the second conductivity-type semiconductor layer 113. For example, in a case in which the first conductivity-type semiconductor layer 111 and the second conductivity-type semiconductor layer 113 are provided as a GaN-based compound semiconductor, the active layer 112 may include an InGaN-based compound semiconductor having a lower level of energy band gap than that of GaN. In addition, the active layer 112 may have a multiple-quantum well (MQW) structure, in which quantum well layers and quantum barrier layers are alternately stacked, such as in an InGaN/GaN structure, but is not limited thereto. The active layer 112 may also have a single quantum well (SQW) structure.

The light emitting structure 110 may include an etching area (EA) in which the second conductivity-type semiconductor layer 113, the active layer 112, and a portion of the first conductivity-type semiconductor layer 111 is etched, and may include a portion of a plurality of mesa areas (MAs) divided by the etching area (EA).

On a top surface of the first conductivity-type semiconductor layer 111 exposed to the EA, a first contact electrode 114 may be disposed to be connected to the first conductivity-type semiconductor layer 111, e.g., to be in direct contact therewith. In addition, on a top surface of the plurality of MAs, a second contact electrode 115 may be disposed to be connected to the second conductivity-type semiconductor layer 113, e.g., to be in direct contact therewith.

In the meantime, in order to cover the active layer 112 exposed to the EA, a passivation layer 110a including an insulating material may be disposed on a side surface of the MA. However, the passivation layer 110a may be selectively disposed, e.g., just cover the active layer 112, or may be omitted.

A first insulating layer 120 may be disposed on the light emitting structure 110 to cover an entirety of the light emitting structure 110. The first insulating layer 120 may include, basically, a material having insulating properties, and may be formed using an inorganic or an organic material. For example, the first insulating layer 120 may include an epoxy-based insulating resin. In addition, the first insulating layer 120 may include silicon oxide or silicon nitride, for example, $SiO_2$, SiN, $SiO_xN_y$, $TiO_2$, $Si_3N_4$, $Al_2O_3$, TiN, AlN, $ZrO_2$, TiAlN, TiSiN, or the like.

The first insulating layer 120 may include a plurality of first openings 121. In detail, the first openings 121 may allow a portion of the first contact electrode 114 and the second contact electrode 115 on the first conductivity-type semiconductor layer 111 and the second conductivity-type semiconductor layer 113, respectively, to be exposed.

The electrode layer 130 may be disposed on the first insulating layer 120, and may be electrically connected to each of the first conductivity-type semiconductor layer 111 and the second conductivity-type semiconductor layer 113 through the first opening 121. The electrode layer 130 may be insulated from the first and second conductivity-type semiconductor layers 111 and 113 by the first insulating layer 120 covering an entirety of a top surface of the light emitting structure 110. In addition, the electrode layer 130 may be connected to the first contact electrode 114 and the second contact electrode 115, exposed through the first openings 121, to be connected to the first conductivity-type semiconductor layer 111 and the second conductivity-type semiconductor layer 113.

Electrical connections between the electrode layer 130 and the first conductivity-type semiconductor layer 111, as well as between the electrode layer 130 and the second conductivity-type semiconductor layer 113, may be variously controlled by the first opening 121 provided in the first insulating layer 120. For example, depending on the number of and a position of the first opening 121, the electrical connections between the electrode layer 130 and the first conductivity-type semiconductor layer 111 and the second conductivity-type semiconductor layer 113 may be variously changed.

The electrode layer 130 may be provided as at least a pair of electrode layers, to allow the first conductivity-type semiconductor layer 111 to be electrically insulated from the second conductivity-type semiconductor layer 113. In other words, a first electrode layer 131 may be electrically connected to the first conductivity-type semiconductor layer 111, a second electrode layer 132 may be electrically connected to the second conductivity-type semiconductor layer 113, and the first electrode layer 131 and the second electrode layer 132 may be separated from each other, to be electrically insulated. For example, the electrode layer 130 may include a material, such as gold (Au), tungsten (W), platinum (Pt), silicon (Si), iridium (Ir), silver (Ag), copper (Cu), nickel (Ni), titanium (Ti), chromium (Cr), and the like and a material including at least one or more alloys thereof.

The second insulating layer 140 may be provided on the electrode layer 130, and may protect the electrode layer 130 in such a manner that the second insulating layer 140 may encompass an entirety thereof. The second insulating layer 140 may include a second opening 141, exposing a portion of the electrode layer 130. The second opening 141 may also be provided as a plurality of openings, to allow a portion of each of the first electrode layer 131 and the second electrode layer 132 to be exposed. The second insulating layer 140 may include a material the same as that of the first insulating layer 120. The insulating layer 140 may also extend between the first and second electrode layers 131, 132 to the first insulating layer 120.

The electrode pad 150 may include a first electrode pad 151 and a second electrode pad 152. The first electrode pad 151 and the second electrode pad 152 may be disposed on the first electrode layer 131 and the second electrode layer 132, which are partially exposed through the second openings 141, respectively. The first electrode pad 151 and the second electrode pad 152 may be electrically connected to the first conductivity-type semiconductor layer 111 and the second conductivity-type semiconductor layer 113, respectively, through the electrode layer 130. The first electrode pad 151 and the second electrode pad 152 may be provided as a plurality of electrode pads, respectively.

In order to have a chip-on-board (COB) structure to implement a flip-chip bonding method, the first electrode pad 151 and the second electrode pad 152 may be oriented in the same direction within the light emitting structure 110.

As illustrated in FIG. 12, two first electrode pads 151 and two second electrode pads 152 may be disposed in a symmetrical manner. Furthermore, the number of the first electrode pad 151 and the second electrode pad 152 may be variously changed. For example, three first electrode pads 151 and three second electrode pads 152 may be disposed in a symmetrical manner.

Figure 14:
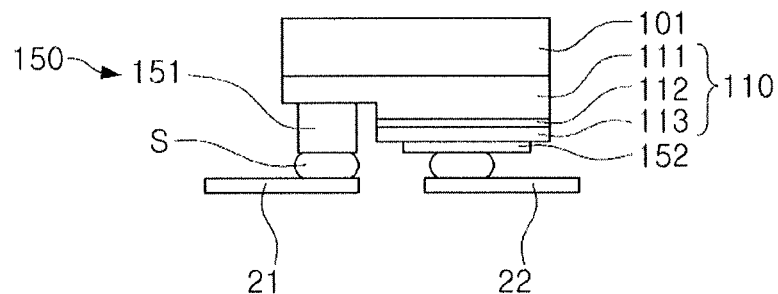
FIGS. 14 to 16 illustrate respective schematic cross-sectional views of a light emitting device according to an example embodiment.

FIG. 14 is a schematic, side cross-sectional view of an example embodiment of a light emitting device employable with embodiments. As illustrated in FIG. 14, a light emitting device 100A may include a substrate 101, a light emitting structure 110, and an electrode pad 150.

The substrate 101 may be provided as a semiconductor growth substrate, and, for example, may include an insulating material and a conductive material, such as sapphire, SiC, $MgAl_2O_4$, MgO, $LiAlO_2$, $LiGaO_2$, GaN, or the like.

The light emitting structure 110 may include a first conductivity-type semiconductor layer 111, a second conductivity-type semiconductor layer 113 and an active layer 112 disposed therebetween. The first conductivity-type semiconductor layer 111 may include a semiconductor doped with an n-type impurity, and may include an n-type nitride semiconductor layer. The second conductivity-type semiconductor layer 113 may include a semiconductor doped with a p-type impurity, and may include a p-type nitride semiconductor layer. However, a stacking order of the first conductivity-type semiconductor layer 111 and the second conductivity-type semiconductor layer 113 may be changed.

The first conductivity-type semiconductor layer 111 and the second conductivity-type semiconductor layer 113 may be formed of a material having a composition of $Al_xIn_yGa_{(1-x-y)}N$ ($0 \le x<1$, $0 \le y<1$, $0 \le x+y<1$), e.g., GaN, AlGaN, InGaN, AlInGaN, or the like.

The active layer 112, between the first conductivity-type semiconductor layer 111 and the second conductivity-type semiconductor layer 113 may include a material having a lower level of energy band gap than that of the first conductivity-type semiconductor layer 111 and the second conductivity-type semiconductor layer 113. For example, in a case in which the first conductivity-type semiconductor layer 111 and the second conductivity-type semiconductor layer 113 are provided as a GaN-based compound semiconductor, the active layer 112 may include an InGaN-based compound semiconductor having a lower level of energy band gap than that of GaN.

In addition, the active layer 112 may have a multiple-quantum well (MQW) structure, in which quantum well layers and quantum barrier layers are alternately stacked, such as an InGaN/GaN structure, but is not limited thereto. The active layer 112 may also have a single quantum well (SQW) structure.

The electrode pad 150 may include a first electrode pad 151 and a second electrode pad 152. The first electrode pad 151 may be disposed on an exposed surface of the first conductivity-type semiconductor layer 111, in which the second conductivity-type semiconductor layer 113, the active layer 112, and a portion of the first conductivity-type semiconductor layer 111 is etched to be exposed, and may be connected to the first conductivity-type semiconductor layer 111. The second electrode pad 152 may be disposed on a surface of the second conductivity-type semiconductor layer 113, in order to be connected thereto.

The first electrode pad 151 and the second electrode pad 152 may include an electrically conductive material, such as Ag, aluminum (Al), Ni, Cr, Cu, Au, palladium (Pd), Pt, tin (Sn), W, rhodium (Rh), Ir, ruthenium (Ru), magnesium (Mg), zinc (Zn), and Ti or at least one or more alloys including the electrically conductive material.

The light emitting device 100A may allow the first electrode pad 151 and the second electrode pad 152 to face the first lead frame 21 and the second lead frame 22. In addition, the first electrode pad 151 and the second electrode pad 152 may be electrically connected to the first lead frame 21 and the second lead frame 22, respectively, through the medium of a connection member S.

Figure 15:
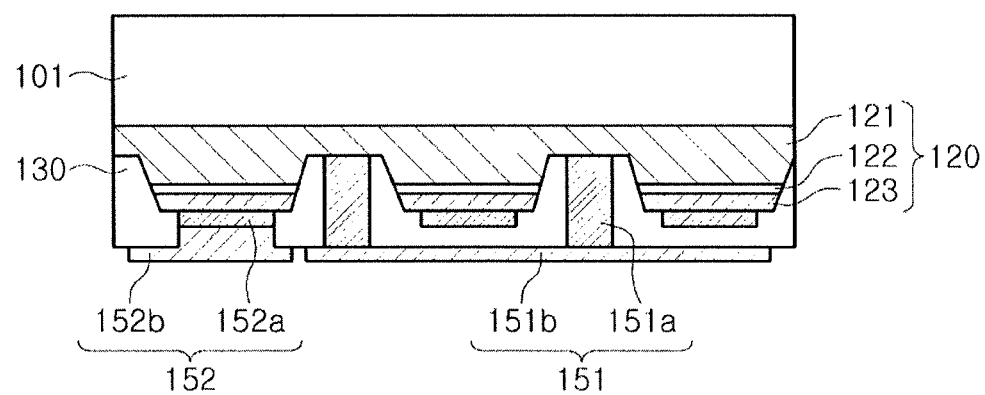

With reference to FIG. 15, a light emitting device 100B, according to an example embodiment, may include a light emitting structure 120 formed on a substrate 101. The light emitting structure 120 may include a first conductivity-type semiconductor layer 121, an active layer 122, and a second conductivity-type semiconductor layer 123.

The light emitting device 100B may include a first electrode pad 151 and a second electrode pad 152, connected to the first conductivity-type semiconductor layer 121 and the second conductivity-type semiconductor layer 123, respectively.

The first electrode pad 151 may include a conductive via 151a penetrating through the second conductivity-type semiconductor layer 123 and the active layer 122, to be connected to the first conductivity-type semiconductor layer 121, and may include an electrode extension portion 151b connected to the conductive via 151a. The conductive via 151a may be surrounded by an insulating layer 130 in order to be electrically isolated from the active layer 122 and the second conductivity-type semiconductor layer 123. The conductive via 151a may be in a region in which the light emitting structure 120 is etched. In order to reduce contact resistance, the number, shape, and pitch of the conductive via 151a, as well as a contact area with respect to the first conductivity-type semiconductor layer 121, and the like, may be designed appropriately.

The second electrode pad 152 may include an ohmic contact layer 152a on the second conductivity-type semiconductor layer 123 and an electrode extension portion 152b.

Figure 16:
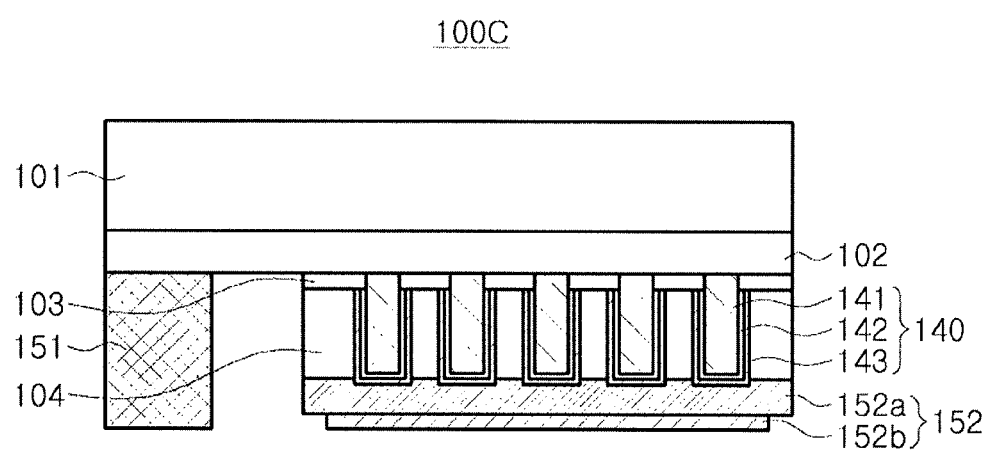

A light emitting device 100C, illustrated in FIG. 16, may include a substrate 101, a first conductivity-type semiconductor base layer 102 formed on the substrate 101, and a plurality of light emitting nanostructures 140 formed on the first conductivity-type semiconductor base layer 102. In addition, the light emitting device 100C may further include an insulating layer 103 and a filling portion 104.

The light emitting nanostructure 140 may include a first conductivity-type semiconductor core 141, and may include an active layer 142 and a second conductivity-type semiconductor layer 143, formed as a shell layer on a surface of the first conductivity-type semiconductor core 141 in sequence. In the example embodiment, the light emitting nanostructure 140 is illustrated to have a core-shell structure, but is not limited thereto. The light emitting nanostructure 140 may have a different structure, such as a pyramid structure.

The first conductivity-type semiconductor base layer 102 may be provided as a layer providing a growth surface of the light emitting nanostructure 140. The insulating layer 103 may provide an open region for growth of the light emitting nanostructure 140, and may be provided as a dielectric material, such as $SiO_2$, $SiN_x$, or the like. The filling portion 104 may allow the light emitting nanostructure 140 to be structurally stabilized, and may play a role of transmitting or reflecting light.

The first electrode pad 151 may be on an exposed surface of the first conductivity-type semiconductor base layer 102, while a second electrode pad 152 may include an ohmic contact layer 152a formed on the light emitting nanostructure 140 and the filling portion 104, and an electrode extension portion 152b. The ohmic contact layer 152a may be provided to be integrated with the electrode extension portion 152b.

Figure 17A:
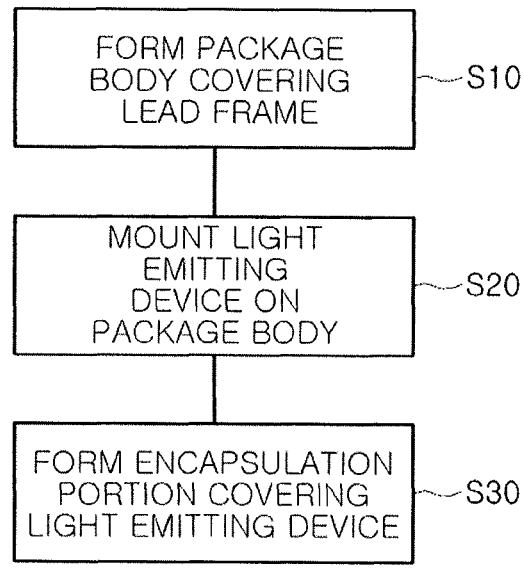
FIGS. 17A and 17B illustrate flow charts of a method of manufacturing a light emitting device package according to an example embodiment.
Figure 17B:
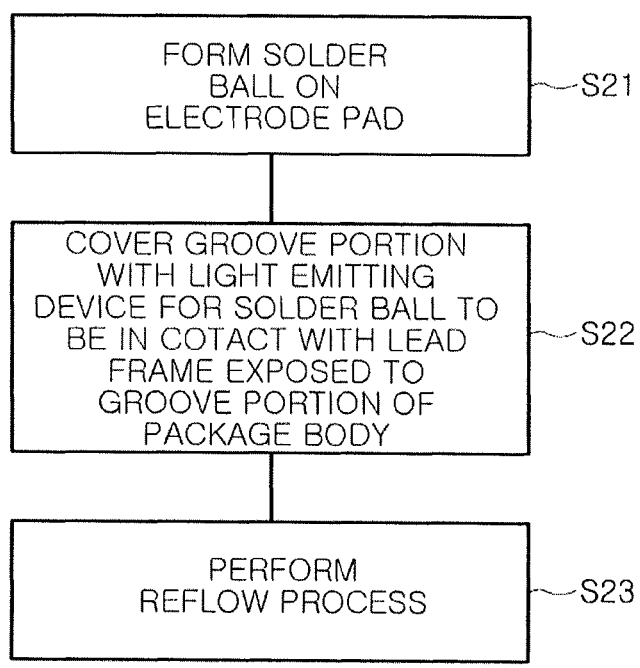

With reference to FIGS. 17A and 17B and FIGS. 18A to 21B, a method of manufacturing a light emitting device package according to an example embodiment will be described. FIGS. 17A and 17B are schematic flow charts of a method of manufacturing a light emitting device package according to an example embodiment, while FIGS. 18A to 21B are schematic views of stages in a method of manufacturing a light emitting device package.

Figure 18A:
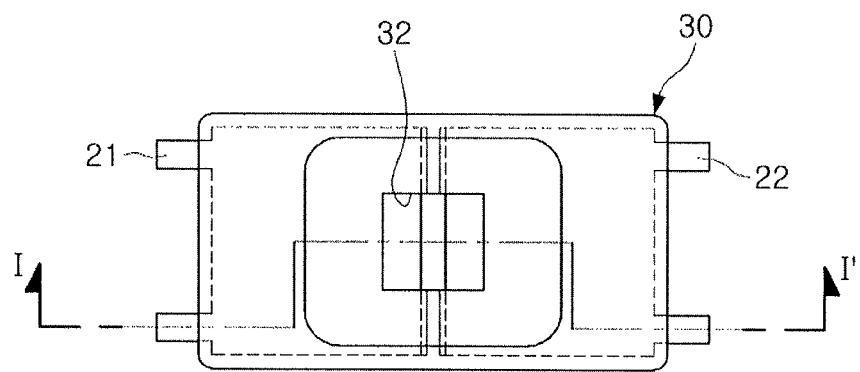
FIGS. 18 to 21 illustrate schematic views stages in a method of manufacturing a light emitting device package according to an example embodiment.
Figure 18B:
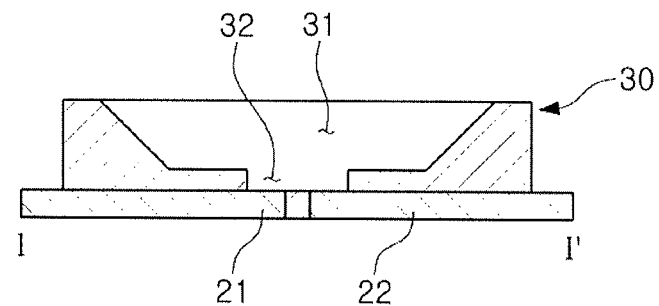

FIGS. 18A and 18B are schematic views of an operation S10 of FIG. 17A of forming a package body covering a lead frame. FIG. 18A is a schematic plan view of a state in which the package body covering the lead frame is formed, while FIG. 18B is a cross-sectional view taken along line IT of the package body and the lead frame in FIG. 18A.

As illustrated in FIGS. 18A and 18B, the lead frame 20 may include the first lead frame 21 and the second lead frame 22, separated from each other, while the package body 30 may cover the first lead frame 21 and the second lead frame 22. Therefore, the first lead frame 21 and the second lead frame 22 may be fixed when the first lead frame 21 and the second lead frame 22 are embedded in the package body 30.

The package body 30 may cover a top surface of both the first lead frame 21 and the second lead frame 22 at a predetermined thickness. The package body 30 may include the reflective cup 31 and the groove portion 32 such that the package body does not cover a portion of the lead frame 20 in a central region of the reflective cup 31 in which a light emitting device 10 is to be mounted. The groove portion 32 may be recessed from a surface of the package body 30, e.g., a through hole, to the lead frame 20, such that nothing is covering the portion of the lead frame 20. Therefore, a portion of each of the first lead frame 21 and the second lead frame 22 may be exposed through the groove portion 32.

The package body 30 may be formed using an injection molding method. For example, when the first lead frame 21 and the second lead frame 22 are disposed in a mold, a liquid resin may be introduced to be hardened, and the mold may be removed, thus forming the package body 30 covering the first lead frame 21 and the second lead frame 22 simultaneously and including the reflective cup 31 and the groove portion 32. According to an example embodiment, the package body 30 may not include the reflective cup 31.

Figure 19A:
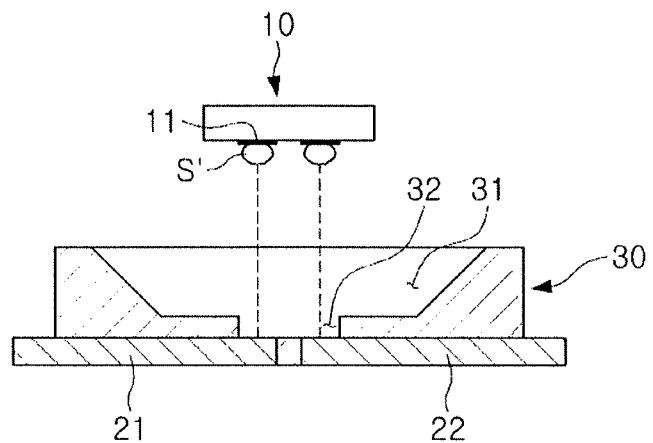
Figure 19B:
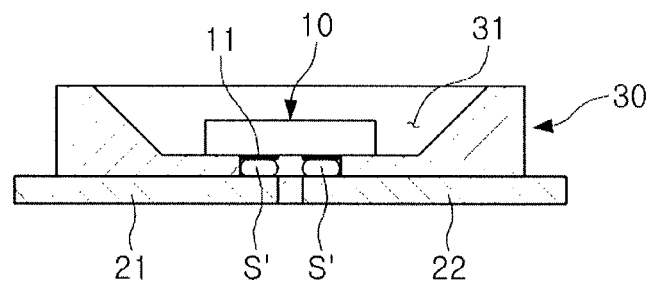

FIGS. 19A and 19B are schematic views of an operation in which a light emitting device is mounted on the package body (see S20 in FIG. 17A).

FIGS. 19A and 19B are respective schematic cross-sectional views of an operation in which the light emitting device is mounted on the package body. With reference to FIG. 17B, along with FIGS. 19A and 19B, an operation in which the light emitting device is mounted will be described. FIG. 17B is a schematic flow chart of an operation S20 in which the light emitting device is mounted.

First, as illustrated in FIG. 19A, the electrode pad 11 of the light emitting device 10 may include a solder ball S' formed thereon (see S21 in FIG. 17B). For example, the solder ball S' may include a SAC-based solder ball.

The light emitting device 10 may include the electrode pad 11 to be connected to the lead frame 20. The electrode pad 11 may include a first electrode pad 11a and a second electrode pad 11b. The light emitting device 10 may have a structure in which the first electrode pad 11a and the second electrode pad 11b are oriented in the same direction.

The light emitting device 10 may be disposed on the package body 30 in such a manner that the first electrode pad 11a and the second electrode pad 11b, including the solder ball S' formed thereon, may face the first lead frame 21 and the second lead frame 22, respectively.

Subsequently, as illustrated in FIG. 19B, the groove portion 32 may be covered by the light emitting device 10 so that the solder ball S' may be in contact with the lead frame 20 exposed through the groove portion 32 (see S22 in FIG. 17B).

The groove portion 32 may have a cross-sectional shape corresponding to a bottom surface of the light emitting device 10, and may have a cross-sectional area less than that of the bottom surface of the light emitting device 10. Therefore, when the light emitting device 10 is disposed on the groove portion 32, an edge of the groove portion 32 may be disposed between the electrode pad 11 and a perimeter of the light emitting device 10.

As such, the light emitting device 10 may be disposed on the package body 30 to cover the groove portion 32, in order to have a structure in which the bottom surface of the light emitting device 10 is in contact with the surface of the package body 30, and a top surface and a side surface thereof are not in contact with the package body 30. The solder ball S' may be accommodated in the groove portion 32, and the light emitting device 10 may cover the groove portion 32, e.g., be in contact with the package body 30, so that the solder ball S' may not be outwardly exposed.

Figure 20A:
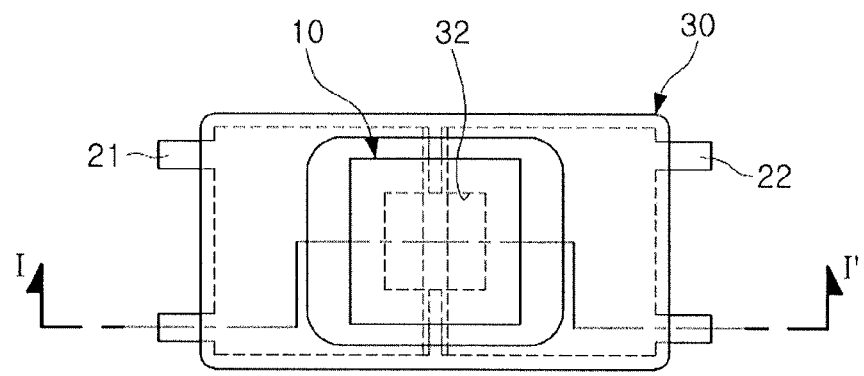
Figure 20B:
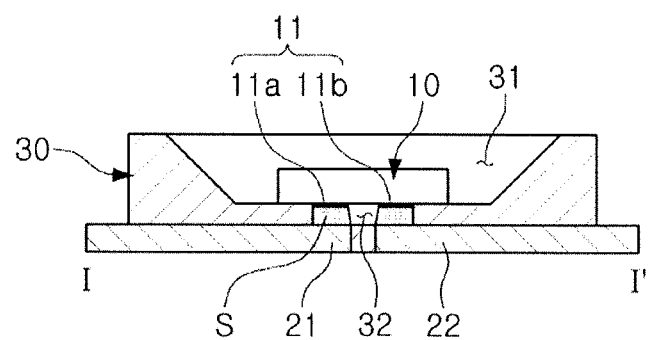

Subsequently, a reflow process may be performed (see S23 in FIG. 17B) so that the solder balls S' reflow to form the conductive bump S that bonds the first electrode pad 11a and the second electrode pad 11b to the first lead frame 21 and the second lead frame 22, respectively, as shown in FIGS. 20A and 20B.

FIG. 20A is a schematic plan view of a state in which the light emitting device is mounted, while FIG. 20B is a cross-sectional view taken along line I-I' of a package body including the light emitting device disposed thereon and a lead frame in FIG. 20A.

The light emitting device 10 may be bonded by flip-chip bonding, using a conductive bump S, resulting from the reflow of the solder balls S', interposed between the lead frame 20 exposed through the groove portion 32 and the electrode pad 11.

Figure 21A:
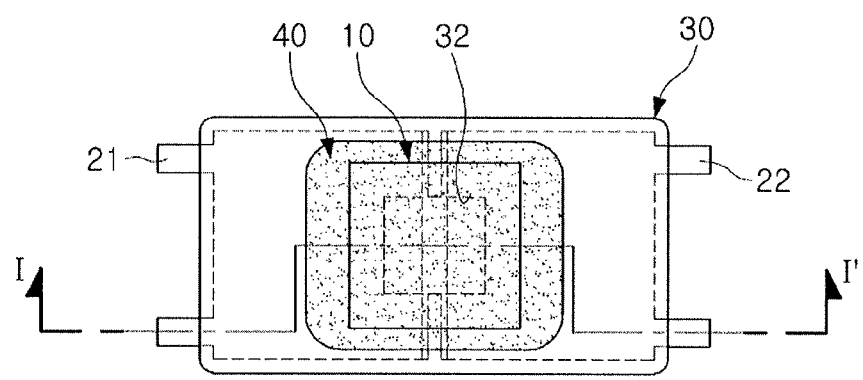
Figure 21B:
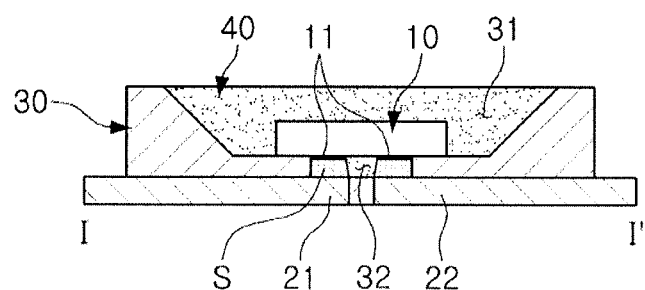

FIGS. 21A and 21B are schematic views of an operation of forming an encapsulation portion, encapsulating the light emitting device (see S30 in FIG. 17A). FIG. 21A is a schematic plan view of a state in which the light emitting device is encapsulated by the encapsulation portion, while FIG. 21B is a cross-sectional view taken along line I-I' of a package body including the encapsulation portion formed thereon and a lead frame in FIG. 21A.

The encapsulation portion 40 may be formed in such a manner that a resin including a phosphor is hardened. The encapsulation portion 40 may include a transparent material or a semitransparent material, e.g., as a silicone resin, an epoxy resin, or the like, to allow light generated by the light emitting device 10 to be outwardly emitted.

Attaching a separate lens to the encapsulation portion 40 may also be performed.

Light emitting device packages having such a structure may include LEDs mounted thereon in such a manner that a solder bump is formed on the lower surfaces of the LEDs, or solder paste is coated on a lead frame. Due to the thickness of solder, a gap may appear between the upper surface of a lead frame and an LED. Due to the gap, light generated by LEDs may be scattered by phosphors included in an encapsulation portion, and a portion of light entering below the LEDs is absorbed by the solder, thus causing optical loss. In addition, LEDs mounted on a light emitting device package have problems in which the LEDs may not be flatly joined thereto when being joined through the medium of solder, or the LEDs may not be in their intended position due to the rotation thereof, or the like. Therefore, the problems have been pointed out as factors compromising the reliability and stability of LEDs.

In contrast, in accordance with embodiments, an LED may be flip chip mounted using solder to have a structure that significantly improves light extraction efficiency. In particular, by having a groove or opening in a mold that is as thick as a solder bump on a lower surface of a flip chip the solder may be protected from outside influences an may be readily maintained in a desired configuration, e.g., position and orientation, thus blocking a path in which light may penetrate through the lower surface of the chip. In detail, grooves may be formed on a surface of mold to allow a portion of a lead frame to be exposed, so that an entirety of regions, except a region of the lead frame in contact with a solder bump, may be coated with mold. Therefore, in a case in which a flip chip is mounted, the lower surface of the chip is in contact with mold, thus avoiding a gap formed by the solder bump. Further, according to embodiments, light extinction, e.g., in which light scattered by a phosphor is lost in the lower surface of the chip, e.g., in which light is absorbed by the solder, may be reduced or eliminated.

As set forth above, according to example embodiments, a light emitting device package preventing optical loss from occurring and improving reliability thereof in a case in which an LED is joined through the medium of solder, or the like and a method of manufacturing the same may be provided.

One or more embodiments may provide a scheme in which, in a package including a light emitting diode (LED) having a flip chip structure, optical loss may be prevented from occurring, and reliability thereof may be improved when the LED is joined.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light emitting device package, comprising:
a package body including a mounting region, the mounting region including a mounting surface for a light emitting device, a groove portion, and a bottom surface lower than the mounting surface, wherein the groove portion extends through the package body along a first direction from the mounting surface to the bottom surface; and
a lead frame supported by the package body, a portion of the lead frame being disposed on the bottom surface and being exposed by the groove portion;
wherein the light emitting device has a first plane on which an electrode pad is disposed, a second plane opposite the first plane, and a third plane disposed between the first plane and the second plane to connect the first plane to the second plane, the light emitting device to be disposed in the mounting region such that the first plane is to be in contact with the mounting surface and the electrode pad is to be in the groove portion,
wherein the groove portion has a surface area smaller than that of the first plane of the light emitting device, and
wherein a portion of the package body is between the lead frame and the light emitting device along the first direction.

2. The light emitting device package as claimed in claim 1, wherein the second plane and the third plane of the light emitting device are spaced from the package body.

3. The light emitting device package as claimed in claim 1, wherein the first plane of the light emitting device includes a first region including the electrode pad and a second region surrounding the first region, the second region is to contact the mounting surface along a perimeter of the groove portion.

4. The light emitting device package as claimed in claim 1, wherein the lead frame and the electrode pad are to be connected through a conductive bump in the groove portion.

5. The light emitting device package as claimed in claim 1, wherein the groove portion surrounds a perimeter of the electrode pad to define a position of the light emitting device.

6. The light emitting device package as claimed in claim 1, wherein the package body includes a reflective cup that surrounds the mounting region and has an internal side wall inclined toward an upper portion of the package body.

7. The light emitting device package as claimed in claim 6, wherein the third plane of the light emitting device is spaced from the internal side wall.

8. The light emitting device package as claimed in claim 1, wherein the package body includes a protrusion on the mounting surface to define a mounting position of the light emitting device.

9. The light emitting device package as claimed in claim 8, wherein the protrusion includes a plurality of protrusions disposed on the mounting surface around the groove portion.

10. The light emitting device package as claimed in claim 1, wherein the electrode pad includes as a plurality of electrode pads, and the groove portion surrounds a perimeter of the plurality of electrode pads adjacent an edge of the light emitting device.

11. The light emitting device package as claimed in claim 1, further comprising an encapsulation portion covering the light emitting device and including a wavelength conversion material.

12. The light emitting device package as claimed in claim 1, wherein the package body includes a connection groove connected to the groove portion in the mounting surface.

13. A light emitting device package, comprising:
a package body, including a mounting region having a mounting surface for mounting a light emitting device, a groove portion, and a bottom surface lower than the mounting surface, wherein the groove portion extends through the package body along a first direction from the mounting surface to the bottom surface; and
a lead frame including a portion supported by the bottom surface and exposed by the groove portion,
wherein the groove portion has a thickness, along the first direction, orthogonal to the lead frame, of a conductive bump to connect the light emitting device and the lead frame, and a width, along a second direction orthogonal to the first direction, less than that of the light emitting device, wherein the groove portion has a surface area smaller than that of the light emitting device, and a portion of the package body is between the lead frame and the light emitting device along the first direction.

14. The light emitting device package as claimed in claim 13, wherein the package body includes a protrusion on the mounting surface to define a mounting position of the light emitting device.

15. The light emitting device package as claimed in claim 13, wherein the groove portion has a width along a third direction, orthogonal to the first and second direction, less than a width of the light emitting device along the third direction.

16. The light emitting device package as claimed in claim 13, wherein the package body includes a connection groove connected to the groove portion in the mounting surface, the connection groove extending along the second direction and having a width along a third direction, orthogonal to the first and second direction, less than a width of the groove portion along the third direction.

17. The light emitting device package as claimed in claim 1, wherein the first plane of the light emitting device is in contact with the package body.

18. The light emitting device package as claimed in claim 1, further comprising a conductive bump in the groove portion between the electrode pad and the lead frame.

19. The light emitting device package as claimed in claim 1, wherein the second plane and the third plane of the light emitting device are separated from the package body.

20. The light emitting device package as claimed in claim 1, wherein the package body includes a protrusion on the mounting surface to define a mounting position of the light emitting device.

21. The light emitting device package as claimed in claim 1, further comprising a light transmissive encapsulation portion disposed on the package body and covering the second plane and the third plane of the light emitting device.

* * * * *